(12) United States Patent
Kim

(10) Patent No.: US 6,281,713 B1
(45) Date of Patent: Aug. 28, 2001

(54) CURRENT SENSE AMPLIFIERS HAVING EQUALIZATION CIRCUITS THERIN THAT INHIBIT SIGNAL OSCILLATIONS DURING ACTIVE MODES

(75) Inventor: Kun-tae Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/470,765

(22) Filed: Dec. 23, 1999

(30) Foreign Application Priority Data

Dec. 28, 1998 (KR) .................................................. 98-59420

(51) Int. Cl.⁷ .............................. G01R 19/00; G11C 7/00; H03F 3/45
(52) U.S. Cl. ............................................. 327/55; 365/203
(58) Field of Search ................................. 327/51, 52, 55; 365/203, 205

(56) References Cited

U.S. PATENT DOCUMENTS

| | | | |
|---|---|---|---|
| 4,370,737 | * | 1/1983 | Chan ..................................... 365/203 |
| 5,258,959 | * | 11/1993 | Dallabora et al. .................... 365/210 |
| 5,553,295 | * | 9/1996 | Pantelakis et al. ................... 395/750 |
| 5,615,161 | * | 3/1997 | Mu ....................................... 365/208 |
| 5,953,259 | * | 9/1999 | Yoon et al. ..................... 365/198.04 |
| 5,959,913 | * | 9/1999 | Raad ..................................... 365/201 |
| 6,072,738 | * | 6/2000 | Brown ................................... 365/203 |

FOREIGN PATENT DOCUMENTS 92-8756    5/1992  (KR) .
92-20241  11/1992  (KR) .

* cited by examiner

Primary Examiner—Terry D. Cunningham
Assistant Examiner—Quan Tra
(74) Attorney, Agent, or Firm—Myers Bigel Sibley & Sajovec

(57) ABSTRACT

Current sense amplifiers include a pair of differential output signal lines and a current sensor electrically coupled to the pair of differential output signal lines. A first equalization device is also provided. The first equalization device is electrically coupled to the pair of differential output signal lines and is responsive to a sense amplifier enable signal (SAEN). In addition, according to a preferred aspect of the present invention, a second equalization device is also provided to reduce the likelihood that the differential outputs of the current sense amplifier will oscillate during sense and amplify operations. This second equalization device is also electrically coupled to the pair of differential output signal lines, however, the second equalization device is not responsive to the sense amplifier enable signal. Instead, the second equalization device is preferably responsive to a power supply signal (e.g., Vcc) and/or reference signal (e.g., Vss) and performs a constant or variable equalization function when the sense amplifier is active.

19 Claims, 6 Drawing Sheets

CURRENT SENSE AMPLIFIERS HAVING EQUALIZATION CIRCUITS THERIN THAT INHIBIT SIGNAL OSCILLATIONS DURING ACTIVE MODES

RELATED APPLICATION

This application is related to Korean Application No. 98-59420, filed Dec. 28, 1998, the disclosure of which is hereby incorporated herein by reference.

FIELD OF THE INVENTION

The present invention relates to integrated circuit devices, and more particularly to current sense amplifiers (CSA).

BACKGROUND OF THE INVENTION

Data stored in a memory cell may be read through a pair of differential input and output signal lines (e.g., an input and output signal line and a complementary input and output signal line) during a data reading operation. The voltage difference between the input and output line and the complementary input and output line may be very small during the reading operation. To sense the small voltage difference, a sense amplifier is frequency used.

There are two common types of sense amplifiers, voltage sense amplifiers (VSA) and current sense amplifiers (CSA). VSAs are used to sense voltage differences and CSAs are used to sense current differences. In general, a current sense amplifier is used when the load of a line connected to an input port of a sense amplifier is large. In a semiconductor memory device, when the capacity of the memory is large, the pair of input and output signal lines are typically long and the load is typically very large. Accordingly, current sense amplifiers are frequently used in connection with large semiconductor memory devices. Also, due to the fact that a current sense amplifier may have a faster sense speed than a voltage sense amplifier, current sense amplifiers are often used in semiconductor memory devices having small data storage capacitors.

Referring to FIG. 1, a circuit diagram of a conventional sense amplifier is illustrated. A current source 11 provides the same amount of current to a differential input signal line INPUT and a complimentary differential input signal line INPUTB during the activation state of an sense amplifier enable signal SAEN (e.g., logic high). At this time, when data is loaded on the differential input signal line INPUT and the complimentary differential input signal line INPUTB, a current difference is generated between INPUT and INPUTB according to the voltage difference between them. A differential current sensor 12 detects the current difference between the pair of differential input signal lines INPUT and INPUTB, converts the current difference into a voltage difference, and outputs the converted voltage difference to a differential output signal line OUTPUT and a complementary differential output signal line OUTPUTB. A current sink 14 lets some of the current from the pair of differential output signal lines OUTPUT and OUTPUTB flow to a ground port VSS during the activation state of the sense amplifier enable signal SAEN. An equalization device 13 electrically connects the pair of differential output signal lines OUTPUT and OUTPUTB and equalizes them when the sense amplifier enable signal SAEN is inactive and the current source is inactive.

The ratio of the voltage difference between the pair of differential output signal lines OUTPUT and OUTPUTB to the voltage difference between the pair of differential input signal lines INPUT and INPUTB (e.g., the degree of amplification) is called the gain. The gain is controlled by regulating the sizes of PMOS transistors P13 and P14 of the differential current sensor 12 and the sizes of NMOS diodes N11 and N12 of the current sink 14. As the gain becomes larger, the sensing speed of the current sense amplifier becomes faster. However, when the gain gets too large, the signals on the pair of differential output signal lines OUTPUT and OUTPUTB may begin to oscillate, as illustrated by FIG. 8. Such oscillations may cause the levels of OUTPUT and OUTPUTB to become switched, and therefore an incorrect data value may be produced during a reading operation.

If the gain of the current sense amplifier is large, the values of OUTPUT and OUTPUTB can oscillate when the power supply voltage VCC is high. The level of the maximum power supply voltage in which oscillation is not generated in the current sense amplifier is called the High-VCC margin. Therefore, in the current sense amplifier, the gain should be appropriately controlled by regulating the sizes of the PMOS transistors P13 and P14 and the sizes of the NMOS diodes N11 and N12 so that the High-VCC margin is high enough to prevent oscillation.

In the conventional current sense amplifier, the High-VCC margin is reduced when the gain is increased in order to make the sensing speed fast. Yet, when the gain is decreased in order to increase the High-VCC margin and reduce the likelihood of oscillations, the sensing speed decreases and the rate at which data can be read from a memory also decreases. Thus, notwithstanding the desired use of current sense amplifiers in large memory devices, there continues to be a need for improved current sense amplifiers that are less susceptible to parasitic oscillators during reading operations.

SUMMARY OF THE INVENTION

It is therefore an object of the present invention to provide improved current sense amplifiers.

It is another object of the present invention to provide current sense amplifiers having reduced susceptibility to sensing errors caused by output oscillations.

It is still another object of the present invention to provide current sense amplifiers having high-Vcc margin and high sensing speed.

These and other objects, advantages and features of the present invention may be provided by a current sense amplifier that comprises a pair of differential output signal lines and a current sensor electrically coupled to the pair of differential output signal lines. A first equalization device is also provided. The first equalization device is electrically coupled to the pair of differential output signal lines and is responsive to a sense amplifier enable signal (SAEN). In addition, according to a preferred aspect of the present invention, a second equalization device is also provided to reduce the likelihood that the differential outputs of the current sense amplifier will oscillate during sense and amplify operations. This second equalization device is also electrically coupled to the pair of differential output signal lines, however, the second equalization device is not responsive to the sense amplifier enable signal. Instead, the second equalization device is preferably responsive to a power supply signal (e.g., Vcc) and/or reference signal (e.g., Vss) and performs a constant or variable equalization function when the sense amplifier is active.

To provide a variable equalization function, the second equalization device preferably comprises a voltage divider having a reference node, and a pass transistor having source and drain regions electrically coupled to the pair of differential output signal lines and a gate electrode electrically coupled to the reference node. Here, the resistance provided by the pass transistor determines the degree to which the second equalization device acts to reduce oscillations at the output of the sense amplifier. This resistance may also be controlled by varying the potential of the reference node in the voltage divider. For example, if the voltage divider is connected between a power supply potential and a ground reference potential, an increase in the magnitude of the power supply potential may be used to increase the potential of the reference node and thereby decrease the resistance of the pass transistor.

DESCRIPTION OF PREFERRED EMBODIMENTS

Figure 1:
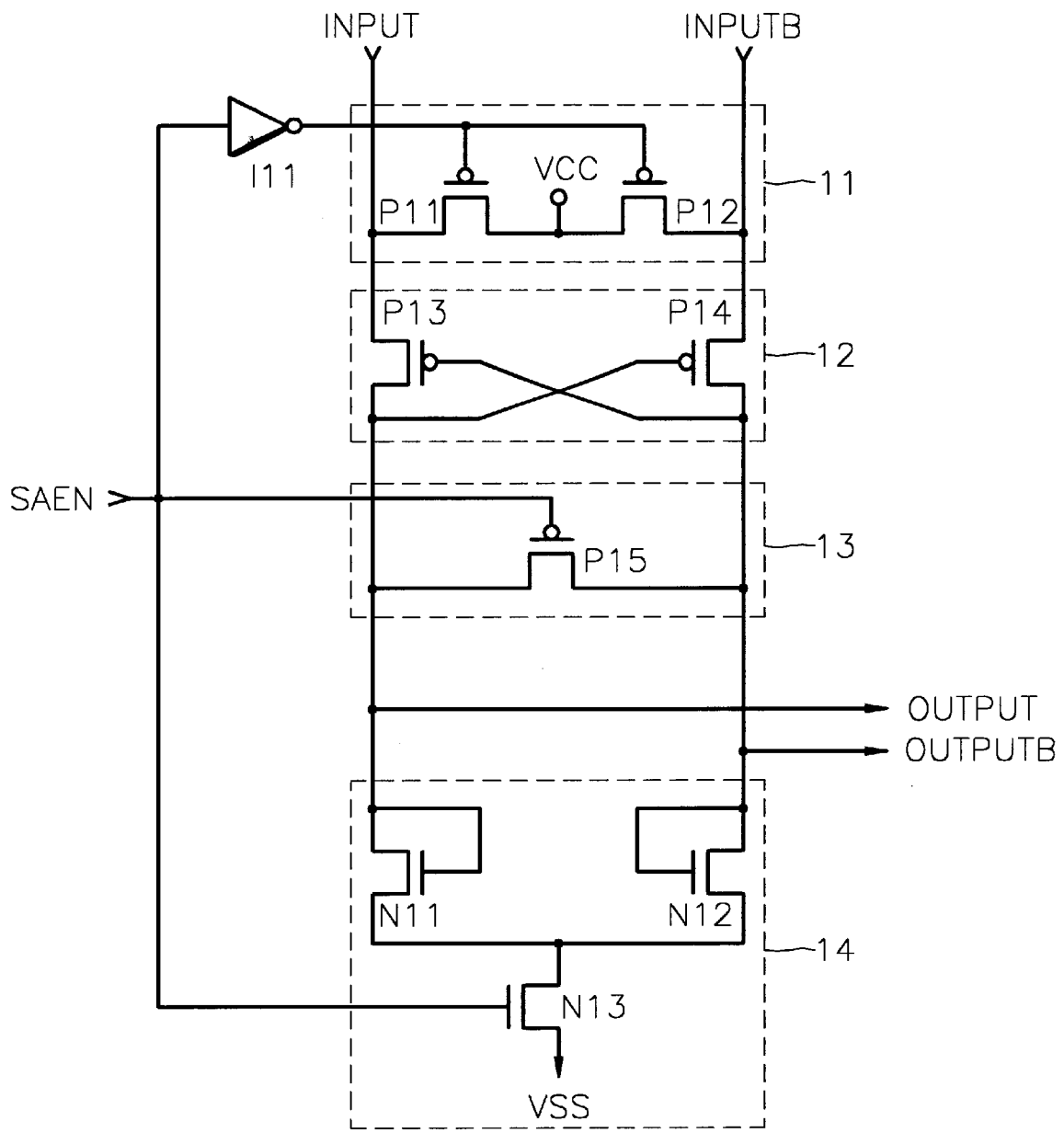
FIG. 1 is an electrical schematic of a conventional current sense amplifier.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the name reference numerals.

Figure 2:
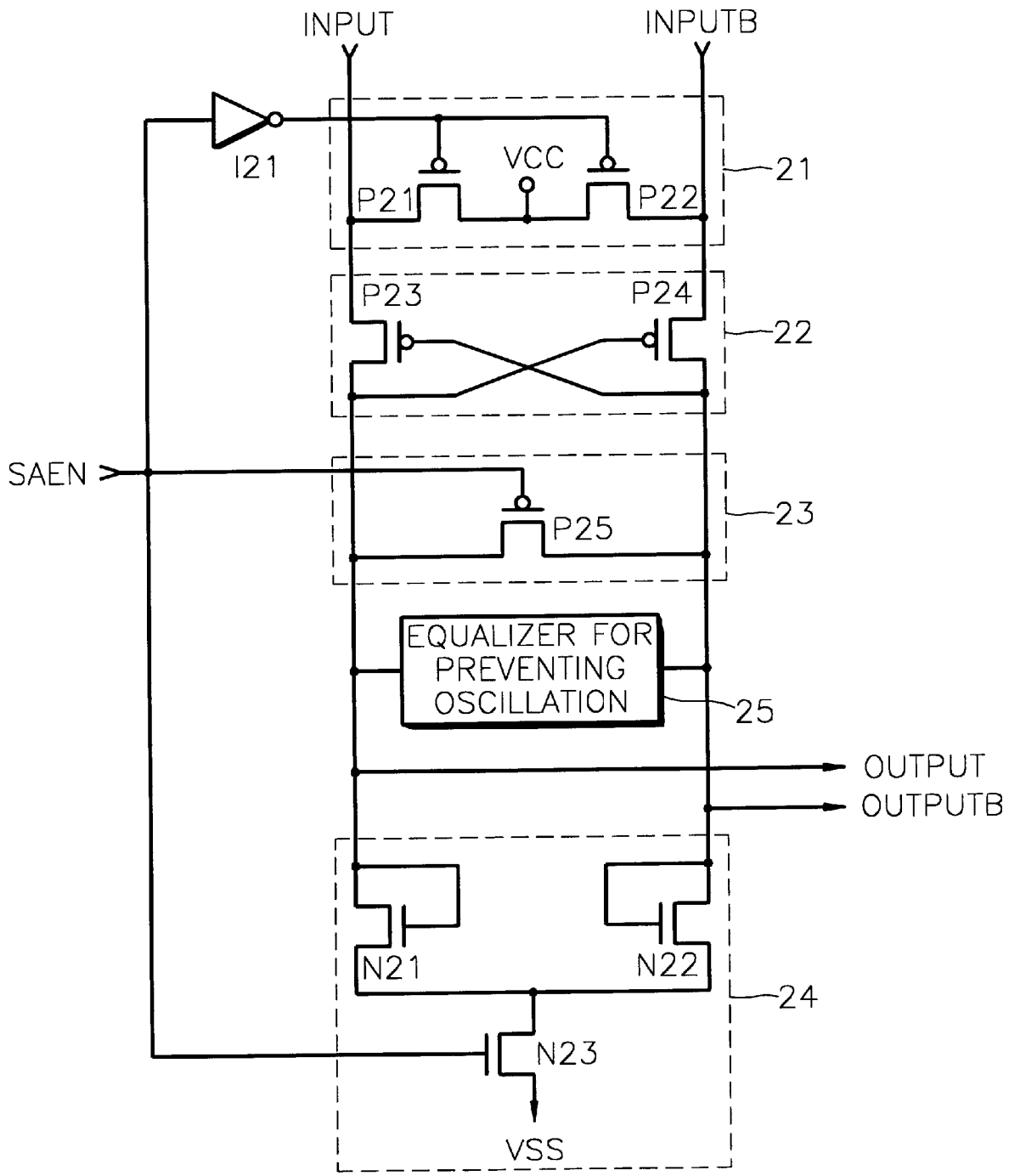
FIG. 2 is an electrical schematic of a current sense amplifier according to the present invention.

Referring to FIG. 2, a circuit diagram of a current sense amplifier according to the present invention is illustrated. This current sense amplifier includes a differential current sensor 22, a first equalization device 23, a current source 21, and a second equalization device 25 that inhibits oscillation. The current sense amplifier may also include a current sink 24.

The differential current sensor 22 includes a pair of PMOS current sense transistors P23 and P24 operating as latches, an NMOS control transistor N23, and a pair of NMOS current sink transistors N21 and N22 operating as diodes. The NMOS control transistor N23 is responsive to the sense amplifier enable signal SAEN. NMOS control transistor N23 is turned on when the sense amplifier enable signal SAEN is active at a logic 1 level (e.g., during the operation of the current sense amplifier).

The first equalization device 23 includes a PMOS equalizing transistor P25. Transistor P25 is electrically connected across the pair of differential output lines OUTPUT and OUTPUTB and to the sense amplifier enable signal line SAEN as illustrated in FIG. 2. The PMOS equalizing transistor P25 is responsive to the sense amplifier enable signal SAEN and is turned on when the sense amplifier enable signal SAEN is inactive (e.g., a logic low) during initialization. When it is turned on, the PMOS transistor P25 equalizes the potentials of the pair of differential output signal lines OUTPUT and OUTPUTB. In other words, the PMOS equalizing transistor P25 electrically connects the pair of differential output signal lines OUTPUT and OUTPUTB together so they are at the same voltage level when the current sense amplifier turns on in response to an active SAEN.

The current source 21 includes a pair of PMOS current source transistors P21 and P22. Transistors P21 and P22 are electrically connected to a power supply voltage VCC, the differential input signal lines INPUT and INPUTB, and the sense amplifier enable signal line SAEN as illustrated in FIG. 2. The pair of PMOS current source transistors P21 and P22 are generally called load transistors. The current source 21 is responsive to the sense amplifier enable signal SAEN. The sense amplifier enable signal SAEN is inverted before it is applied to the gates of transistors P21 and P22. P21 and P22 are turned on during the activation state of the sense amplifier enable signal SAEN (e.g., a logic high) and provide the same amount of current to the differential input signal line INPUT and the complementary differential input signal line INPUTB. At this time, when data is loaded on the differential input signal lines INPUT and INPUTB, a current difference is established between INPUT and INPUTB according to the voltage difference between them.

Although the current source 21 is described in this embodiment as utilizing P-channel transistors in combination with an inverted sense amplifier enable signal SAEN, the P-channel embodiment is used as a descriptive device only and is not meant to limit the embodiment of the current source to P-channel transistors. The P-channel current source 21 can be replaced with an N-channel version of the current source, as known in the art of analog design.

According to a preferred aspect of the present invention, the second equalization device 25 electrically connects the pair of differential output signal lines OUTPUT and OUTPUTB together in order to inhibit oscillation of the voltages across the pair of differential output signal lines OUTPUT and OUTPUTB. The second equalization device 25 is not influenced by the value of the sense amplifier enable signal SAEN. Connecting the pair of differential output signal lines reduces the voltage difference between the values of the pair of differential output signal lines OUTPUT and OUTPUTB. In particular, when the second equalization device 25 turns on, current flows from the differential output signal line (OUTPUT or OUTPUTB) having the higher voltage to the differential signal line having the lower voltage through the second equalization device 25. Accordingly, the voltage difference between the output signal is reduced. Therefore, it is possible to inhibit the gain of the current sense amplifier from becoming excessively large. As a result, the likelihood of oscillation of the output signals is reduced and the High-VCC margin of the current sense amplifier according to the present invention is increased.

The first equalization device 23 and the second equalization device 25 may be resistive structures. The resistance of the second equalization device 25 is typically substantially larger than the resistance of the first equalization device 23. Moreover, the resistance provided by the second equalization device 25 is set at a level sufficient to achieve a desired High-VCC margin and sense speed.

Figure 3:
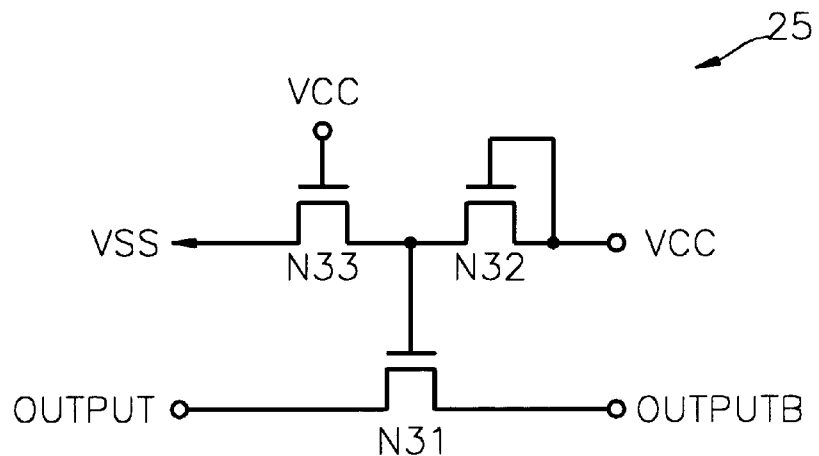
FIG. 3 is an electrical schematic of a preferred equalization device according to a first embodiment of the present invention.

Referring now to FIG. 3, the first embodiment of the equalization device 25 for inhibiting oscillation is illustrated. This equalization device 25 includes an NMOS equalizing transistor N31 acting as a pass transistor, a first NMOS clamp transistor N32, and a second NMOS clamp transistor N33. The transistors N31, N32, and N33 are electrically coupled to the pair of differential output signal lines OUTPUT and OUTPUTB, the power supply voltage VCC, the ground voltage VSS, and to each other as illustrated in FIG. 3. The first NMOS clamp transistor N32 provides current and the second NMOS clamp transistor N33 sinks current so that charges do not accumulate on the gate of the NMOS equalizing transistor N31. The first and second clamp transistors N32 and N33 also form a voltage divider having an intermediate reference node that is connected to the gate of transistor N31.

According to a preferred aspect of the first embodiment, the NMOS equalizing transistor N31 does not turn on when the power supply voltage is at a low level (e.g., the High-VCC margin is held at a low voltage) because oscillation of the values of the differential output signal lines is unlikely when Vcc is low. However, the NMOS equalization transistor N31 does turn on when the operating power supply voltage Vcc is high and the High-VCC margin is also driven to a high level. Thus, the embodiment of FIG. 3 can automatically provide a desired degree of oscillation clamping as the value of VCC varies from low levels (where the likelihood of oscillation is small) to high levels (where the likelihood is greater). In other words, the NMOS equalizing transistor N31 preferably only turns on when it is needed (e.g., when High-VCC is set to a high level).

A voltage of 2.0 volts can be applied to the gate of the NMOS equalizing transistor N31 when the operating power supply voltage is 3.0 volts by regulating the sizes (i.e., widths) of the first and second NMOS clamp transistors N32 and N33 and thereby regulating the top and bottom resistances of the voltage divider. The voltage difference between the gate and the source of the NMOS equalizing transistor N31 is reduced (and the drain-to-source resistance of N31 is increased) for a normal operating power supply voltage (e.g., 3 volts). In addition, because the voltage difference between the pair of differential output signal lines is not reduced when VCC is low, the gain of the current sense amplifier shown in FIG. 2 is not reduced and the high sensing speed of the current sense amplifier is maintained. As the operating power supply voltage (VCC) increases (e.g., to at least 4 volts), the voltage difference between the gate and the source of the NMOS equalizing transistor N31 increases. Accordingly, the NMOS equalizing transistor N31 is turned on to a greater extent. As a result, since the voltage difference is reduced when the power supply voltage is high (e.g., the High-VCC margin), the oscillation of the output signals sent to the pair of differential output signal lines OUTPUT and OUTPUTB is inhibited.

Figure 4:
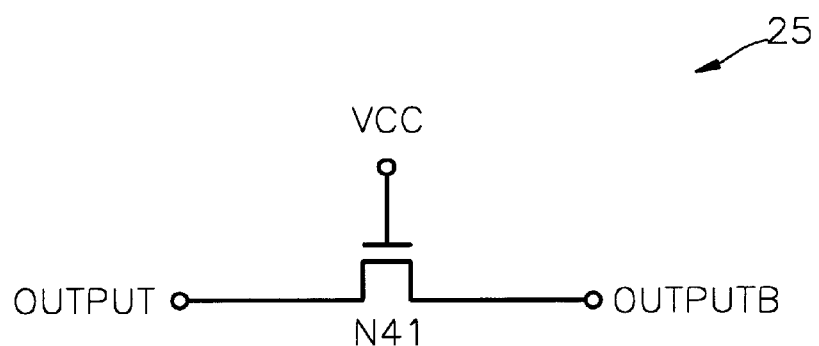
FIG. 4 is an electrical schematic of a preferred equalization device according to a second embodiment of the present invention.

Referring now to FIG. 4, a second embodiment of the equalization device 25 for inhibiting oscillation is illustrated. This equalization device 25 includes a single NMOS equalizing transistor N41. The transistor N41 is electrically coupled to the pair of differential output signal lines OUTPUT and OUTPUTB and the power supply voltage VCC as illustrated in FIG. 4. Here, the width of transistor N41 is preferably chosen to provide a desired amount of on-state clamping resistance.

Figure 5:
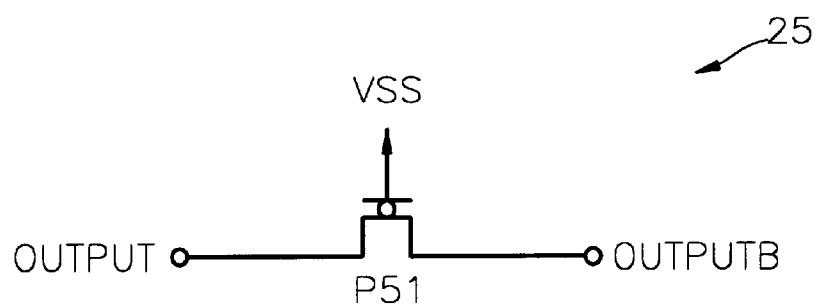
FIG. 5 is an electrical schematic of a preferred equalization device according to a third embodiment of the present invention.

Referring now to FIG. 5, a third embodiment of the equalization device 25 for inhibiting oscillation is illustrated. This equalization device 25 includes a PMOS equalizing transistor P51. The transistor P51 is electrically coupled to the pair of differential output signal lines OUTPUT and OUTPUTB and the ground voltage VSS as illustrated in FIG. 5. The width of transistor P51 can also be chosen to achieve a desired amount of clamping.

The voltage difference between the pair of differential output signal lines OUTPUT and OUTPUTB is reduced by implementing either one of the embodiments of the second equalization device 25 illustrated in FIG. 4 and FIG. 5. Since this voltage difference is reduced, the oscillation of the values of the pair of differential output signal lines OUTPUT and OUTPUTB is inhibited. Inhibiting this oscillation allows the High-VCC margin to be increased.

Figure 6:
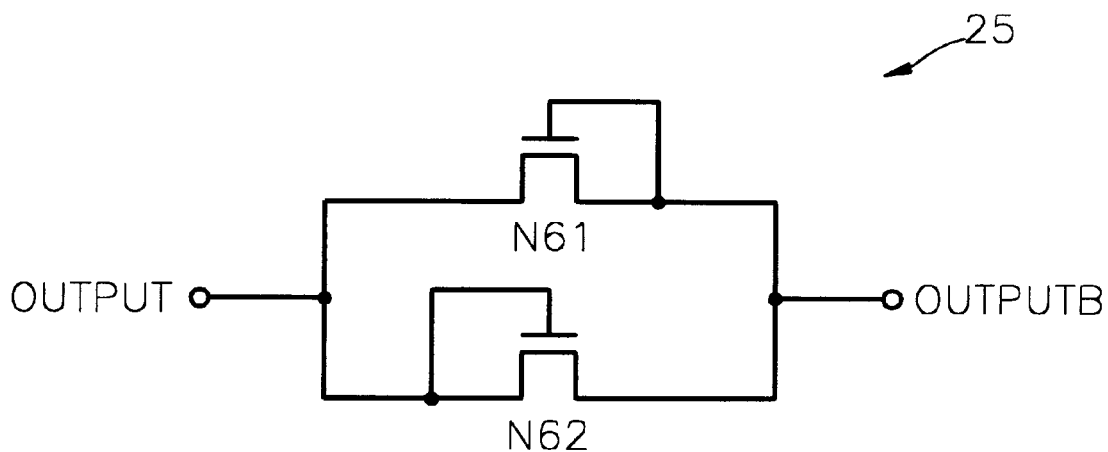
FIG. 6 is an electrical schematic of a preferred equalization device according to a fourth embodiment of the present invention.

Referring now to FIG. 6, a fourth embodiment of the equalization device for inhibiting oscillation 25 is illustrated. The equalization device for inhibiting oscillation according to the fourth embodiment includes a first NMOS clamp transistor N61 and second NMOS clamp transistor N62. Transistors N61 and N62 are electrically coupled to the differential output signal lines OUTPUT an OUTPUTB as illustrated in FIG. 6. These transistors N61 and N62 operate as antiparallel-connected diodes. When the voltage of the complementary differential output signal line OUTPUTB is higher than the voltage of the differential output signal line OUTPUT, current flows from OUTPUTB to OUTPUT through the first NMOS clamp transistor N61. On the other hand, when the voltage of the differential output signal line OUTPUT is higher than the voltage of the complementary differential output signal line OUTPUTB, current flows from the OUTPUT to OUTPUTB through the second NMOS clamp transistor N62. As a result, the voltage difference between the pair of differential output signal lines OUTPUT and OUTPUTB is reduced and the oscillation of the output signals sent to OUTPUT and OUTPUTB is inhibited.

Figure 7:
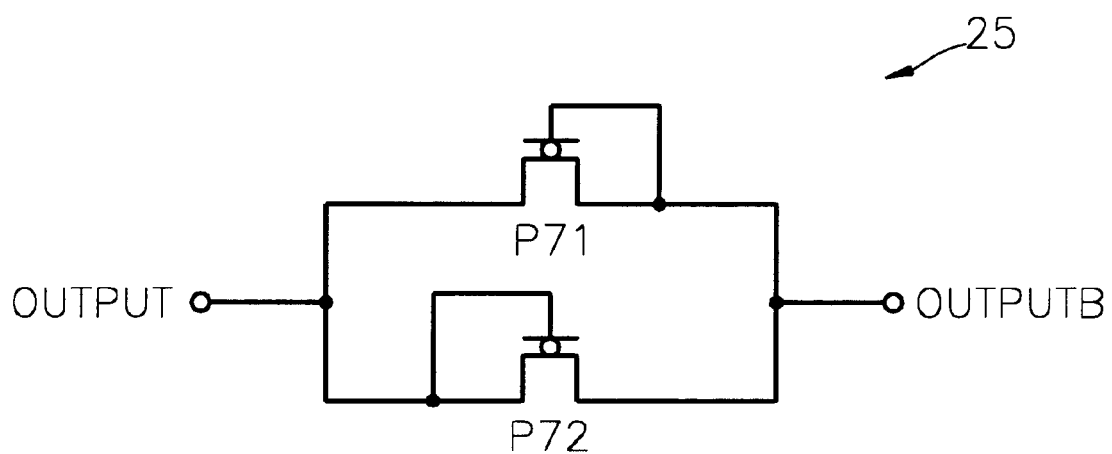
FIG. 7 is an electrical schematic of a preferred equalization device according to a fifth embodiment of the present invention.

Referring to FIG. 7, a fifth embodiment of the equalization device for inhibiting oscillation 25 is illustrated. The equalization device for inhibiting oscillation according to the fifth embodiment includes a first PMOS clamp transistor P71 and a second PMOS clamp transistor P72. The transistors P71 and P72 are electrically coupled to the pair of differential output signal lines OUTPUT and OUTPUTB as illustrated in FIG. 7. When the voltage of the complementary differential output signal line OUTPUTB is higher then the voltage of the differential output signal line OUTPUT, current flows from OUTPUTB to OUTPUT through the second PMOS clamp transistor P72. On the other hand, when the voltage of the differential output signal line OUTPUT is higher than the voltage of the complementary differential output signal line OUTPUTB, current flows from OUTPUT to OUTPUTB through the first PMOS clamp transistor P71. As a result, since the voltage difference between the pair of differential output signal lines OUTPUT and OUTPUTB is reduced, the oscillation of the output signals is inhibited.

According to the equalization devices for inhibiting oscillation of the second through fifth embodiments, the sensing speed of the current sense amplifier may be decreased since the voltage difference between the pair of differential output signal lines OUTPUT and OUTPUTB is reduced in the normal power supply voltage region (e.g., 3 volts). However, it is possible to prevent the sensing speed from decreasing too much by regulating the sizes of the PMOS current sense transistors P23 and P24 of the differential current sensor 22 shown in FIG. 2 and the sizes of the NMOS current sink transistors N21 and N22 of the current sink 24 shown in FIG. 2.

Figure 8:
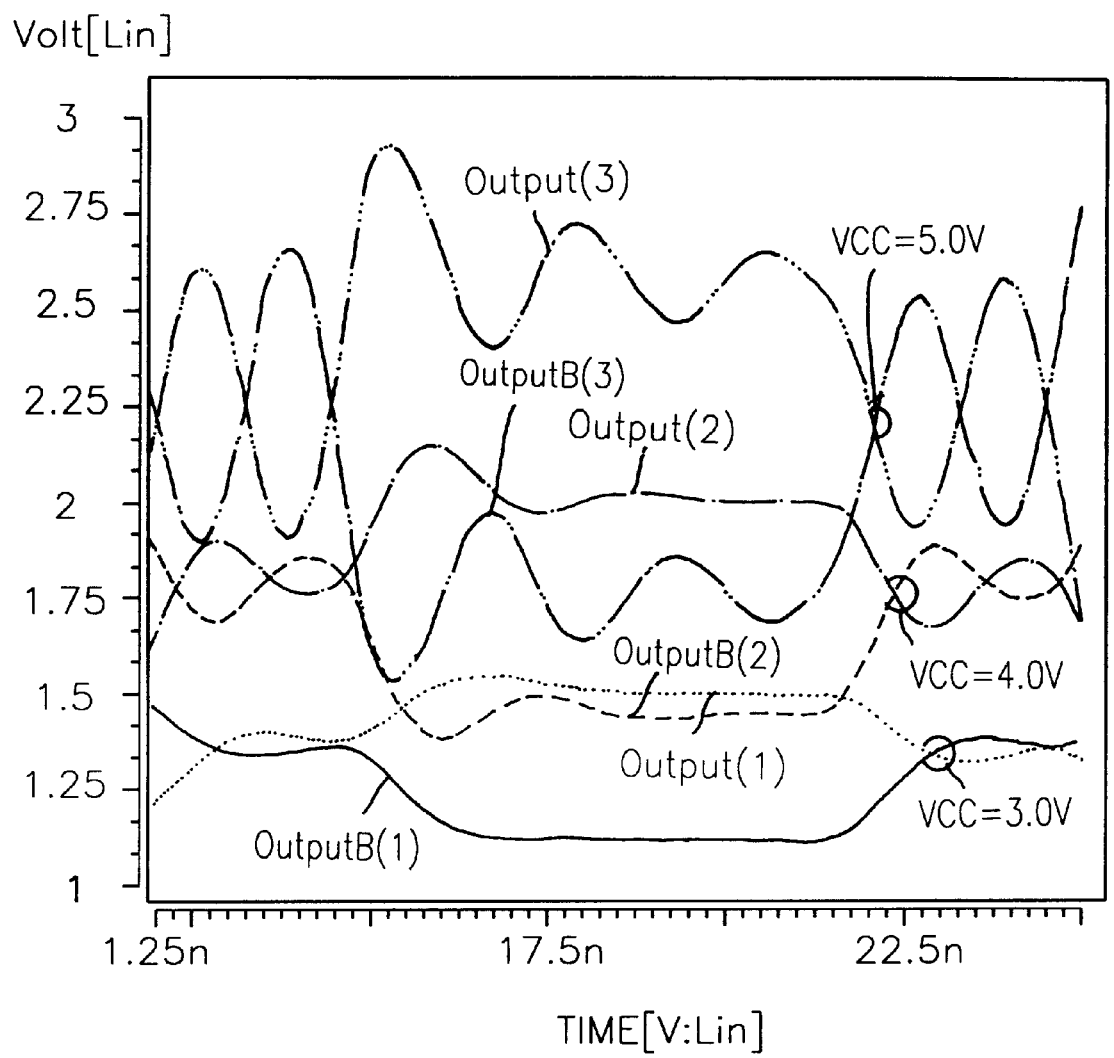
FIG. 8 is a timing diagram that illustrates waveforms corresponding to signals at the output of the current sense amplifier of FIG. 1.
Figure 9:
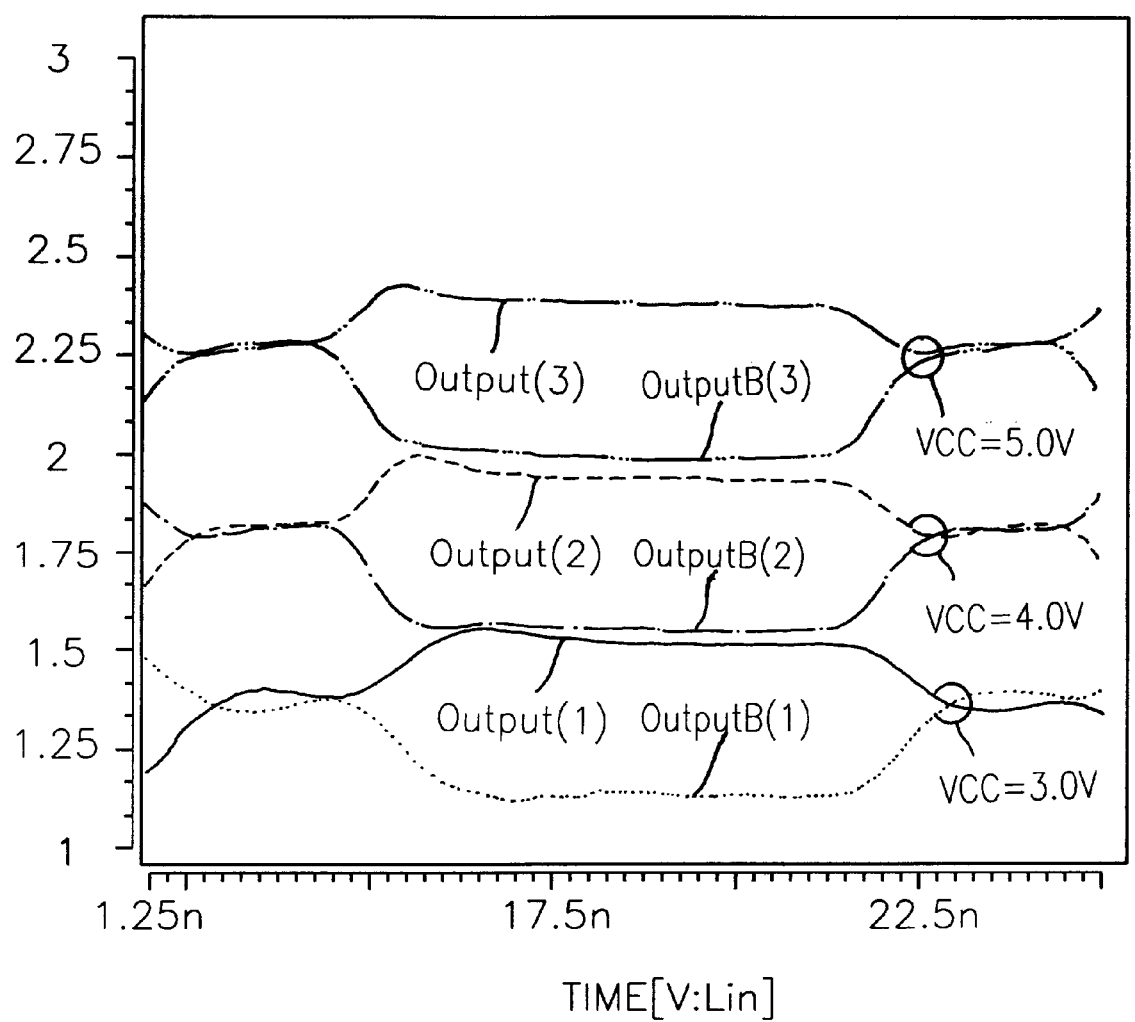
FIG. 9 is a timing diagram that illustrates waveforms corresponding to signals at the output of the current sense amplifier of FIG. 2.

FIG. 8 illustrates waveforms of the output signals of the conventional current sense amplifier shown in FIG. 1. FIG. 9 shows waveforms of the output signals of a current sense amplifier according to the present invention shown in FIG. 2. FIGS. 8 and 9 show simulation results under the same conditions. In FIGS. 8 and 9, OUTPUT(1) and OUTPUTB(1) denote waveforms of the differential output signals sent to the pair of differential output signal lines OUTPUT and OUTPUTB when the power supply voltage VCC is 3.0 volts. OUTPUT(2) and OUTPUTB(2) denote waveforms of the output signals sent to the pair of differential data output lines OUTPUT and OUTPUTB when the power supply voltage VCC is 4.0 volts. OUTPUT(3) and OUTPUTB(3) denote the waveforms of the output signals sent to the pair of differential output signal lines OUTPUT and OUTPUTB when the power supply voltage VCC is 5.0 volts.

Referring now to FIG. 8, the output signals sent to the pair of differential output signal lines OUTPUT and OUTPUTB oscillate more as the power supply voltage VCC becomes higher in the conventional current sense amplifier shown in FIG. 1. Referring now to FIG. 9, in the current sense amplifier according to the present invention shown in FIG. 2, the output signals sent to the pair of differential output signal lines OUTPUT and OUTPUTB oscillate to a much lesser degree even when the power supply voltage VCC increases.

In the current sense amplifier according to the present invention, a high sensing speed is maintained in a normal operating power supply voltage region. The High-VCC margin is large since the oscillation of the values of the differential output signal lines is inhibited in the high power supply voltage region by including an equalization device that is electrically coupled between a pair of differential output signal lines.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A current sense amplifier, comprising:
   a pair of differential input signal lines;
   a current source electrically coupled to said pair of differential input signal lines;
   a pair of differential output signal lines;
   a current sensor having a first pair of terminals electrically coupled to said pair of differential input signal lines and a second pair of terminals electrically coupled to said pair of differential output signal lines;
   a first equalization device that is electrically coupled to said pair of differential output signal lines and is responsive to a sense amplifier enable signal; and
   a second equalization device that is electrically coupled to said pair of differential output signal lines and is not responsive to the sense amplifier enable signal.

2. The sense amplifier of claim 1, wherein said second equalization device electrically connects said pair of differential output signal lines together by a variable resistor having a resistance value that is a function of a magnitude of a power supply signal, when said current sensor is active.

3. The sense amplifier of claim 1, further comprising a current sink that is electrically coupled to said pair of differential output signal lines and is responsive to the sense amplifier enable signal.

4. The sense amplifier of claim 3, wherein said second equalization device comprises:
   a voltage divider having a reference node; and
   a pass transistor having source and drain regions electrically coupled to said pair of differential output signal lines and a gate electrode electrically coupled to the reference node.

5. The sense amplifier of claim 1, wherein said second equalization device comprises:
   a voltage divider having a reference node; and
   a pass transistor having source and drain regions electrically coupled to said pair of differential output signal lines and a gate electrode electrically coupled to the reference node.

6. The sense amplifier of claim 1, wherein said second equalization device comprises a pass transistor having source and drain regions electrically coupled to said pair of differential output signal lines and a gate electrode electrically coupled to a reference potential having a sufficient magnitude to bias the pass transistor in a conductive state.

7. A current sense amplifier, comprising:
   a pair of differential output signal lines;
   a current sensor electrically coupled to said pair of differential output signal lines;
   a first equalization device that is electrically coupled to said pair of differential output signal lines and is responsive to a sense amplifier enable signal; and
   a second equalization device that is electrically coupled to said pair of differential output signal lines and is not responsive to the sense amplifier enable signal, said second equalization device comprising a pair of diodes connected in antiparallel.

8. The sense amplifier of claim 7, wherein the diodes comprise MOS transistors.

9. A current sense amplifier, comprising:
   a pair of differential input signal lines;
   a pair of differential output signal lines;
   a current sensor having a first pair of terminals electrically coupled to said pair of differential input signal lines and a second pair of terminals electrically coupled to said pair of differential output signal lines; and
   an equalization device that is electrically coupled to said pair of differential output signal lines, said equalization device comprising a voltage divider having a reference node that is maintained at a first voltage that varies as a function of a magnitude of a power supply voltage, and a first MOS transistor having source and drain regions electrically connected to said pair of differential output signal lines and a gate electrode electrically coupled to the reference node of the voltage divider so that a resistance between the source and drain regions of the first MOS transistor varies inversely with the magnitude of the power supply voltage.

10. The current sense amplifier of claim 9, wherein the voltage divider comprises second and third MOS transistors electrically connected in series between a reference signal line and a power supply signal line.

11. The current sense amplifier of claim 10, wherein the second MOS transistor is configured as a diode.

12. A sense amplifier, comprising:

a pair of differential input signal lines;

a pair of differential output signal lines;

a current sensor having a first pair of terminals electrically coupled to said pair of differential input signal lines and a second pair of terminals electrically coupled to said pair of differential output signal lines; and an equalization device that electrically connects said pair of differential output signal lines together when said current sensor is active, by a variable resistor having a resistance value that is a function of a magnitude of a power supply signal.

13. The sense amplifier of claim 12, wherein the variable resistor has a resistance value that is inversely proportional to the magnitude of the power supply signal.

14. A sense amplifier of a semiconductor device, enabled by an enable signal, receiving a pair of complementary signals from a pair of data input lines, amplifying them, and outputting amplified signals to a pair of data output lines, comprising:

a current source for supplying current to the pair of data input lines when the enable signal is activated;

a sensor for sensing a current difference between the pair of data input lines, converting the result into a voltage difference, and outputting the voltage difference to the pair of data output lines;

a first equalizer for equalizing the pair of data output lines for initialization when the enable signal is deactivated;

a second equalizer for equalizing the pair of data output lines for preventing oscillation of the output signals output to the pair of data output lines; and a current sink for letting the current of the pair of data output lines flow to a ground port when the enable signal is activated.

15. The sense amplifier of claim 14, wherein the second equalizer comprises:

an NMOS equalizing transistor having a source connected to one of the pair of data output lines and having a drain connected to the other of the pair of data output lines;

a first NMOS clamp transistor to the gate and the drain of which a power supply voltage is applied and the source of which is connected to the gate of the NMOS equalizing transistor; and a second NMOS clamp transistor the drain of which is connected to the gate of the NMOS equalizing transistor, to the gate of which the power supply voltage is applied, and having a source, a ground voltage applied to the source.

16. The sense amplifier of claim 14, wherein the second equalizer comprises an NMOS equalizing transistor having a source connected to one of the pair of data output lines, and having a drain connected to the other of the pair of output lines, and having a gate, the power supply voltage applied to the gate.

17. The sense amplifier of claim 14, wherein the second equalizer comprises a PMOS equalizing transistor the source of which is connected to one of the pair of data output lines, the drain of which is connected to the other of the pair of output lines, to the gate of which a ground voltage is applied.

18. The sense amplifier of claim 14, wherein the second equalizer comprises:

a first NMOS clamp transistor the drain and the gate of which are connected to one of the pair of data output lines and the source of which is connected to the other of the pair of output lines; and a second NMOS clamp transistor the drain and the gate of which are connected to the other of the pair of data output lines and the source of which is connected to one of the pair of output lines.

19. The sense amplifier of claim 14, wherein the second equalizer comprises:

a first PMOS clamp transistor the drain and the gate of which are connected to one of the pair of data output lines and the source of which is connected to the other of the pair of data output lines; and a second PMOS clamp transistor the drain and the gate of which are connected to the other and the source of which is connected to one of the pair of data output.

* * * * *